US008227799B2

(12) United States Patent
Liu et al.

(10) Patent No.: US 8,227,799 B2
(45) Date of Patent: Jul. 24, 2012

(54) THIN FILM TRANSISTOR

(75) Inventors: Kai Liu, Beijing (CN); Chen Feng, Beijing (CN); Kai-Li Jiang, Beijing (CN); Liang Liu, Beijing (CN); Shou-Shan Fan, Beijing (CN)

(73) Assignees: Tsinghua University, Beijing (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 226 days.

(21) Appl. No.: 12/651,146

(22) Filed: Dec. 31, 2009

(65) Prior Publication Data
US 2011/0037124 A1 Feb. 17, 2011

(30) Foreign Application Priority Data
Aug. 14, 2009 (CN) .......................... 2009 1 0109336

(51) Int. Cl.
*H01L 29/12* (2006.01)
*H01L 29/786* (2006.01)
(52) U.S. Cl. ...... 257/40; 257/72; 257/288; 257/E51.003; 257/E51.04; 257/E39.008; 977/748; 977/750
(58) Field of Classification Search .................. None
See application file for complete search history.

(56) References Cited

U.S. PATENT DOCUMENTS

| | | | |
|---|---|---|---|
| 6,648,711 B1 * | 11/2003 | Jang et al. ........................ 445/51 |
| 6,962,839 B2 * | 11/2005 | Wei et al. ...................... 438/195 |
| 7,253,431 B2 * | 8/2007 | Afzali-Ardakani et al. .... 257/20 |
| 8,012,585 B2 * | 9/2011 | Liu et al. ........................ 428/408 |
| 2003/0178617 A1 | 9/2003 | Appenzeller et al. |
| 2004/0245527 A1 * | 12/2004 | Tsukagoshi et al. ............ 257/77 |
| 2006/0231946 A1 * | 10/2006 | Pan et al. ........................ 257/712 |
| 2007/0003711 A1 * | 1/2007 | Hwang et al. ................. 428/1.31 |
| 2007/0108480 A1 * | 5/2007 | Nanai et al. .................... 257/288 |
| 2009/0283752 A1 * | 11/2009 | Jiang et al. ....................... 257/24 |
| 2009/0305055 A1 * | 12/2009 | Shimizu ......................... 428/426 |

FOREIGN PATENT DOCUMENTS

CN 1669160 A 9/2005

OTHER PUBLICATIONS

Artukovic, E., M. Kaempgen, D. S. Hecht, S. Roth, and G. Grüner. "Transparent and Flexible Carbon Nanotube Transistors." Nano Letters 5.4 (2005): 757-60.*

Gelinck, Gerwin H., H. Edzer A. Huitema, Erik Van Veenendaal, Eugenio Cantatore, Laurens Schrijnemakers, Jan B. P. H. Van Der Putten, Tom C. T. Geuns, Monique Beenhakkers, Jacobus B. Giesbers, Bart-Hendrik Huisman, Eduard J. Meijer, Estrella Mena Benito, Fred J. Touwslager, Albert W. Marsman, Bas J. E. Van Rens, and Dago M. De Leeuw. Flexible Acti.*

(Continued)

*Primary Examiner* — Victor A Mandala
*Assistant Examiner* — Joseph Schoenholtz
(74) *Attorney, Agent, or Firm* — Altis Law Group, Inc.

(57) ABSTRACT

The present disclosure provides a thin film transistor which includes a source electrode, a drain electrode, a semiconducting layer, an insulating layer and a gate electrode. The drain electrode is spaced apart from the source electrode. The semiconducting layer is electrically connected with the source electrode and the drain electrode. The gate electrode is insulated from the source electrode, the drain electrode, and the semiconducting layer by the insulating layer. At least one of the gate electrode, the drain electrode, the source electrode includes a carbon nanotube composite layer.

19 Claims, 14 Drawing Sheets

OTHER PUBLICATIONS

Han, Song, Xiaolei Liu, and Chongwu Zhou. "Template-Free Directional Growth of Single-Walled Carbon Nanotubes on A- and R-Plane Sapphire." Journal of the American Chemical Society 127. 15 (2005): 5294-295.*

Huang, Houjin. "Purification and Alignment of Arc-synthesis Singal Walled Carbon Nanotube Bundles." Chemical Physics Letters 356 (2002): 567-72.*

Javey, Ali, Jing Guo, Damon B. Farmer, Qian Wang, Erhan Yenilmez, Roy G. Gordon, Mark Lundstrom, and Hongjie Dai. "Self-Aligned Ballistic Molecular Transistors and Electrically Parallel Nanotube Arrays." Nano Letters 4.7 (2004): 1319-322.*

Javey, Ali, Jing Guo, Qian Wang, Mark Lundstrom, and Hongjie Dai. "Ballistic Carbon Nanotube Field-effect Transistors." Nature 424. 6949 (2003): 654-57.*

Kocabas, C., N. Pimpakar, O. Yesilyurt, S. J. Kang, M. A. Alam, and J. A. Rogers. "Experimental and Theoretical Studies of Transport through Large Scale, Partially Aligned Arrays of Single-Walled Carbon Nanotubes in Thin Film Type Transistors." Nano Letters 5th ser. 7 (2007): 1195-202.*

Liu, Xiaolei, Koungmin Ryu, Alexander Badmaev, Song Han, and Chongwu Zhou. "Diameter Dependence of Aligned Growth of Carbon Nanotubes on A-Plane Sapphire Substrates." Journal of Physical Chemistry C 112.41 (2008): 15929-5933.*

Nanda, K. K., A. Maisels, F. E. Kruis, H. Fissan, and S. Stappert. "Higher Surface Energy of Free Nanoparticles." Physical Review Letters 91.10 (2003).*

Pribat, Didier, and P. Bondavalli. "Thin-Film Transistors and Circuits Based on Carbon Nanotubes." Journal of Display Technology (2011).*

Ural, Ant, Yiming Li, and Hongjie Dai. "Electric-field-aligned Growth of Single-walled Carbon Nanotubes on Surfaces." Applied Physics Letters 81.18 (2002): 3464.*

Yamada, Toshishige. "Modeling of Carbon Nanotube Schottky Barrier Modulation under Oxidizing Conditions." Physical Review B 69.12 (2004).*

Yu, Qingkai, Guoting Qin, Hao Li, Zhenhai Xia, Yibo Nian, and Shin-Shem Pei. "Mechanism of Horizontally Aligned Growth of Single-Wall Carbon Nanotubes on R-Plane Sapphire." The Journal of Physical Chemistry B 110.45 (2006): 22676-2680.*

Zhang, X., K. Jiang, C. Feng, P. Liu, L. Zhang, J. Kong, T. Zhang, Q. Li, and S. Fan. "Spinning and Processing Continuous Yarns from 4-Inch Wafer Scale Super-Aligned Carbon Nanotube Arrays." Advanced Materials 18.12 (2006): 1505-510.*

Zhang, Y. "Metal Coating on Suspended Carbon Nanotubes and Its Implication to Metal-tube Interaction." Chemical Physics Letters 331.1 (2000): 35-41.*

Zhou, Yangxin, Anshu Gaur, Seung-Hyun Hur, Coskun Kocabas, Matthew A. Meitl, Moonsub Shim, and John A. Rogers. "P-Channel, N-Channel Thin Film Transistors and P-n Diodes Based on Single Wall Carbon Nanotube Networks." Nano Letters 4.10 (2004): 2031-035.*

* cited by examiner

THIN FILM TRANSISTOR

This application claims all benefits accruing under 35 U.S.C. §119 from China Patent Application No. 200910109336.0, filed on Aug. 14, 2009 in the China Intellectual Property Office.

BACKGROUND

1. Technical Field

The present invention relates to thin film transistors and, particularly, to a carbon nanotube based thin film transistor.

2. Description of Related Art

A typical thin film transistor (TFT) is made of a substrate, a gate electrode, an insulation layer, a drain electrode, a source electrode, and a semiconducting layer. The thin film transistor performs a switching operation by modulating an amount of carriers accumulated in an interface between the insulation layer and the semiconducting layer from an accumulation state to a depletion state, with applied voltage to the gate electrode, to change an amount of the current passing between the drain electrode and the source electrode.

Usually, the material of the semiconducting layer is amorphous silicone (a-Si), poly-silicone (p-Si), or organic semiconducting material. The material of the insulating layer is silicon nitride ($Si_3N_4$) or silicon dioxide ($SiO_2$). The material of the gate electrode, source electrode, and drain electrode is metals or alloys. However, the conventional thin film transistor is inflexible, and not suitable for use in a flexible electronic device (e.g., a flexible display). Further, the gate, source, and drain electrodes made of metals or alloys will melt at high temperature. Thus, thin films transistors cannot be used in extreme conditions or environments.

What is needed, therefore, is a TFT in which can handle extreme conditions.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
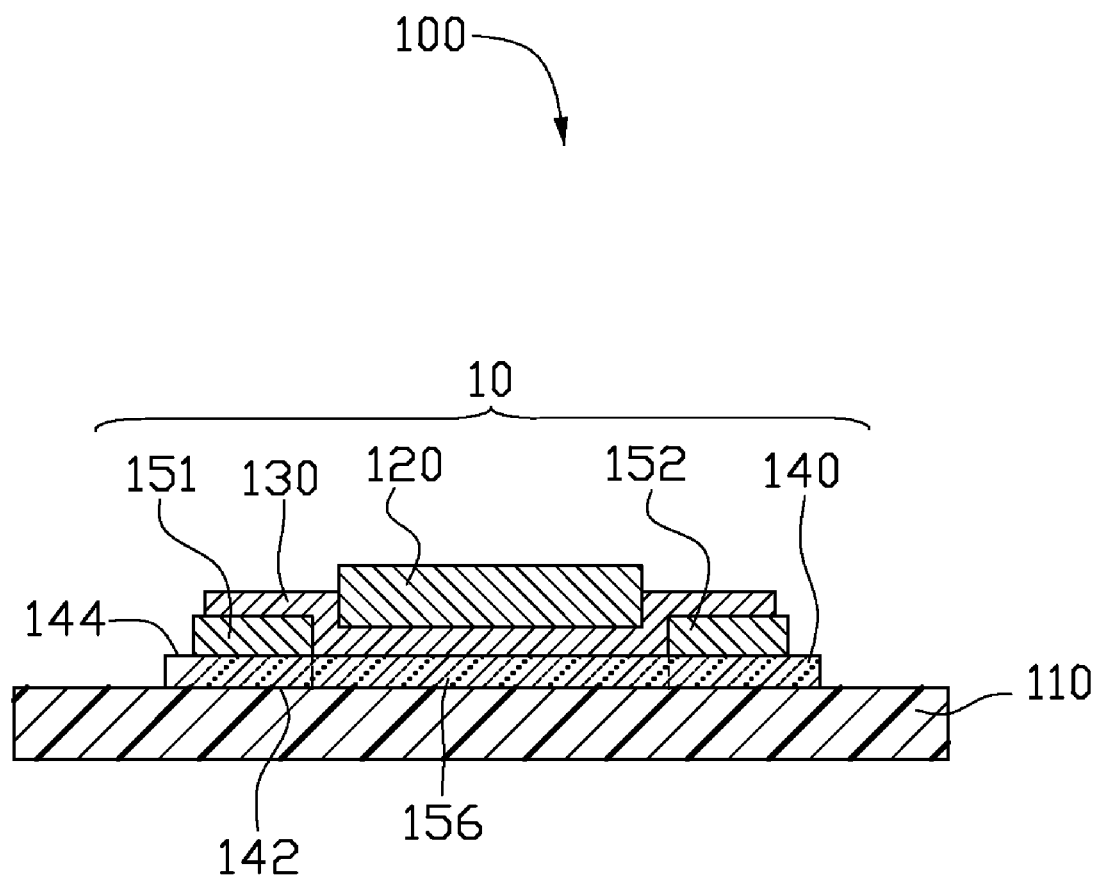
FIG. 1 is a cross sectional view of one embodiment of a thin film transistor.

Referring to FIG. 1, a thin film transistor 10 of one embodiment is applied in a thin film transistor panel 100. The thin film transistor panel 100 can include an insulating substrate 110 and a plurality of thin film transistors 10 (only one is shown in the FIG. 1) located thereon.

The insulating substrate 110 is provided for supporting the thin film transistors 10. The material of the insulating substrate 110 can be the same as a substrate of a printed circuit board (PCB), and can be rigid materials (e.g., p-type or n-type silicon, silicon with an silicon dioxide layer formed thereon, crystal, crystal with a oxide layer formed thereon), or flexible materials (e.g., plastic or resin). In one embodiment, the material of the insulating substrate is glass. The shape and size of the insulating substrate 110 is arbitrary. The plurality of thin film transistors 10 can be located on the insulating substrate 110 in a predetermined order.

The thin film transistor 10 can be a top gate structure. The transistor 10 includes a semiconducting layer 140, a source electrode 151, a drain electrode 152, an insulating layer 130, and a gate electrode 120. The semiconducting layer 140 has a first bottom surface 142 and a top surface 144 opposite to the bottom surface 142. The semiconducting layer 140 is located on the insulating substrate 110. The bottom surface 142 of the semiconducting layer 140 is in direct contact with a top surface of the insulating substrate 110. The source electrode 151 and the drain electrode 152 are spaced apart from each other and electrically connected to the semiconducting layer 140. The source electrode 151 and the drain electrode 152 are in directly contact with the top surface 144 of the semiconducting layer 140. The insulating layer 130 is located between the semiconducting layer 140 and the gate electrode 120. The insulating layer 130 includes a first portion located on the top surface 144 of the semiconducting layer 140 and between the source electrode 151 and the drain electrode 152. The insulating layer 130 further includes two second portions extending from two top ends of the first portion and covering on top of the source electrode 151, and the drain electrode 152. The gate electrode 120 is located on the first portion of the insulating layer 130 and insulated from the semiconducting layer 140, the source electrode 151, and the drain electrode 152 by the insulating layer 130. A channel 156 is formed in the semiconducting layer 140 at a region between the source electrode 151 and drain electrode 152. The channel 156 is just a portion of the semiconducting layer 140. The source electrode 151, the drain electrode 152, nor the insulating layer 130 extend into channel 156. In the FIG. 1, the two broken lines in the semiconducting layer 140 are used to label out the region of the channel 156.

The source electrode 151 and drain electrode 152 can be located on the top surface 144 of the semiconducting layer 140 or on the insulating substrate 110 and covered by the semiconducting layer 140. In one embodiment, the source electrode 151 and drain electrode 152 are located on the top surface 144 of the semiconducting layer 140, and at the same side of the semiconducting layer 140 as the gate electrode 120. In another embodiment, the source electrode 151 and the drain electrode 152 are located on the insulating substrate 110 and covered by the semiconducting layer 140. The source electrode 151 and the drain electrode 152 are at a different side of the semiconducting layer 140 than the gate electrode 120. In another embodiment, the source electrode 151 and the drain electrode 152 can be formed on the insulating substrate 110 and be coplanar with the semiconducting layer 140.

The material of the semiconducting layer 140 can be amorphous silicone (a-Si), poly-silicone (p-Si), organic semiconducting material, or semiconducting carbon nanotubes. In one embodiment, the semiconducting layer 140 is a semiconducting carbon nanotube layer. The semiconducting carbon nanotube layer includes a plurality of single-walled carbon nanotubes, double-walled carbon nanotubes, or combination thereof. A diameter of the single-walled carbon nanotubes is in the range from about 0.5 nanometers to about 50 nanometers. A diameter of the double-walled carbon nanotubes is in the range from about 1.0 nanometer to about 50 nanometers. In one embodiment, the diameter of the semiconducting carbon nanotubes is less than 10 nanometers.

The semiconducting carbon nanotube layer can be a semiconducting carbon nanotube film. The semiconducting carbon nanotube film can have a single carbon nanotube film or a plurality of stacked carbon nanotube films. The carbon nanotube film is consist of a plurality of carbon nanotubes, ordered or otherwise, and has a uniform thickness. The carbon nanotube film can be an ordered film or a disordered film. In the disordered film, the carbon nanotubes are disordered. The disordered carbon nanotubes entangle with each other to form the disordered carbon nanotube film. The disordered carbon nanotube film can be isotropic. In the ordered film, the carbon nanotubes are primarily oriented along the same direction or different directions in each film and parallel to a surface of the carbon nanotube film. Different stratums/layers of films can have the nanotubes offset from the nanotubes in other films. In one embodiment, the ordered carbon nanotube film is a drawn carbon nantoube film which is drawn from a carbon nantoube array, and includes a plurality of successive and oriented carbon nanotube segments joined end to end by van der Waals attractive force. In one embodiment, the semiconducting layer is consist of two layers of drawn carbon nanotube film. When the carbon nanotube layer includes a plurality of stacked ordered carbon nanotube films, the carbon nanotubes in different carbon nanotube films can be aligned along the same direction, or aligned along different directions. An angle α between the alignment directions of the carbon nanotubes in each two adjacent carbon nanotube films can range from about 0 degrees to about 90 degrees. The semiconducting layer 140 can include a plurality of carbon nanotube wires. The carbon nanotube wires can be untwisted carbon nanotube wires or twisted carbon nanotube wires. The carbon nanotube wires includes a plurality of carbon nanotube segments joined end to end by van der Waals attractive force. When the source electrode 151 and drain electrode 152 are made of a metallic carbon nanotube composite layer and the semiconducting layer 140 is made of a semiconducting carbon nanotube layer, the contacted resistance between the semiconducting layer 140 and the source electrode 151, drain electrode 152 can be reduced.

A length of the semiconducting layer 140 can be arranged from about 1 micrometer to about 100 micrometers. A width of the semiconducting layer 140 can be in a range from about 1 micrometer to about 1 millimeter. A thickness of the semiconducting layer 140 can be in a range from about 0.5 nanometers to about 100 micrometers. A length of the channel 156 can be in a range from about 1 micrometer to about 100 micrometers. A width of the channel 156 can be in a range from about 1 micrometer to about 1 millimeter. In one embodiment, the length of the semiconducting layer 140 is about 50 micrometers, the width of the semiconducting layer is about 300 micrometers, the thickness of the semiconducting layer 140 is about 1 micrometer, the length of the channel 156 is about 40 micrometers, and the width of the channel 156 is about 300 micrometers.

At least one of the source electrode 151, the drain electrode 152, and the gate electrode 120 comprises of a carbon nanotube composite layer 20. In one embodiment, each of the source electrode 151, the drain electrode 152, and the gate electrode 120 comprises the carbon nanotube composite layer 20. The carbon nanotube composite layer 20 can have a uniform thickness. The thickness of the carbon nanotube composite layer 20 is in a range from about 1.5 nanometers to about 1 millimeter. A light transmittance of the carbon nanotube composite layer 20 is in a range from about 70% to about 95%.

Figure 2:
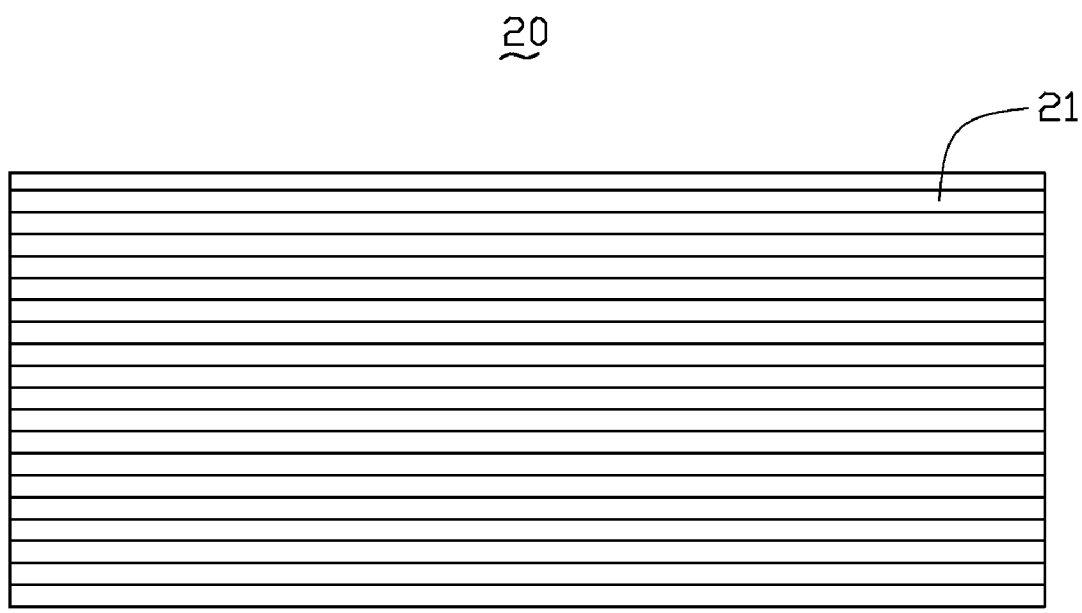
FIG. 2 is a schematic view of one embodiment of a carbon nanotube composite layer.

Referring to FIG. 2, the carbon nanotube composite layer 20 can include a carbon nanotube layer (not labeled) and a metal coating (not labeled) located on an outer surface of each of the carbon nanotubes 21 of the carbon nanotube layers. The carbon nanotube layer includes a plurality of carbon nanotubes 21 joined end-to-end by van der Waals attractive force to form a free-standing structure. The carbon nanotube composite layer 20 includes at least one carbon nanotube film. The carbon nanotube film can also be the free-standing structure. The thickness of the free-standing film can be in a range from about 0.5 nanometers to about 100 micrometers. The term "free-standing", includes, but is not limited to a structure that does not have to be formed on a surface of a substrate and/or can support its own weight. The carbon nanotube films can be stacked and/or coplanar. The carbon nanotube segments includes a plurality of carbon nanotubes 21 parallel to each other and substantially parallel to a surface of the carbon nanotube film. The carbon nanotubes 21 can be primarily oriented along the same direction in each film.

Figure 3:
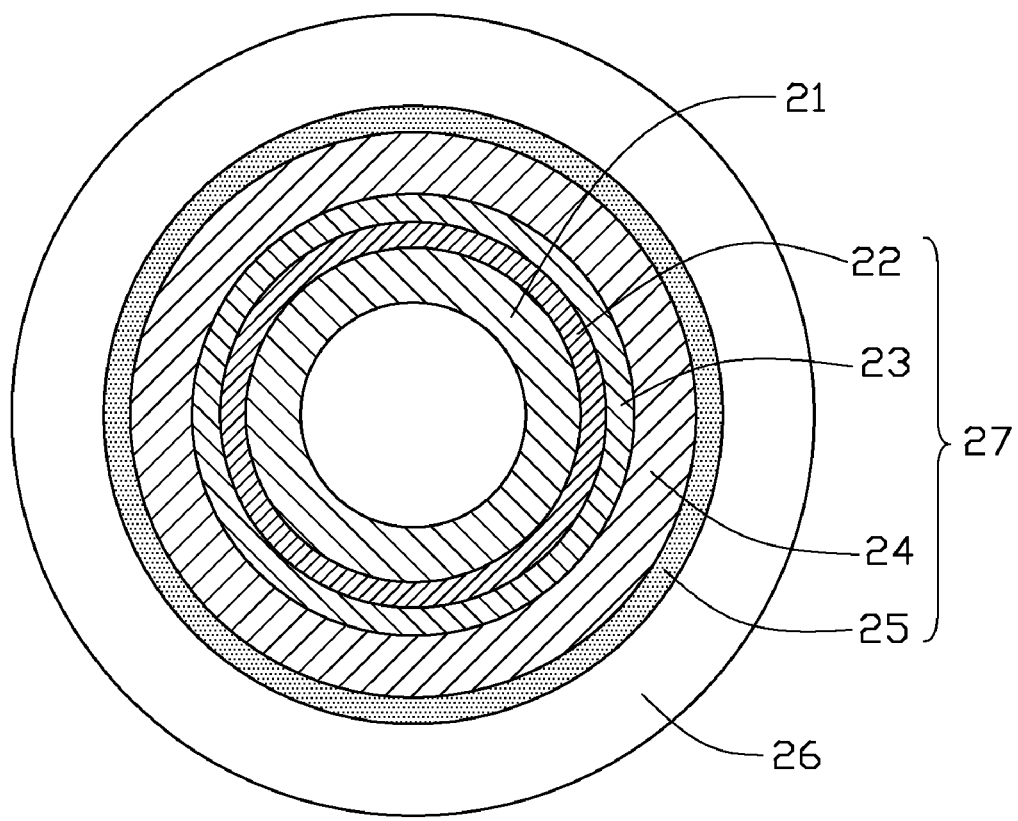
FIG. 3 is a schematic view of a single carbon nanotube in the carbon nanotube composite layer of FIG. 2.

Referring to FIG. 3, substantially all of the carbon nanotubes 21 in the carbon nanotube composite layer 20 have metal coating 27. The metal coating 27 can further include a wetting layer 22, a transition layer 23, a conductive layer 24, and an anti-oxidation layer 25. The wetting layer 22 is the most inner layer, and it coats the surface and combines directly with of the carbon nanotube 21. The transition layer 23 covers and wraps the wetting layer 22. The conductive layer 24 covers and wraps the transition layer 23. The anti-oxidation layer 25 covers and wraps the conductive layer 24.

The carbon nanotubes typically cannot be adequately wetted by most metallic materials. Thus, the wetting layer 22 can be used to wet the carbon nanotube 21, as well as combine the carbon nanotube 21 with the conductive layer 24. The material of the wetting layer 22 can be iron (Fe), cobalt (Co), nickel (Ni), palladium (Pd), titanium (Ti), or alloys thereof. A thickness of the wetting layer 22 can range from about 1 nanometer to about 10 nanometers. In one embodiment, the material of the wetting layer 22 is Ni and the thickness is about 2 nanometers. The wetting layer 22 is optional.

The transition layer 23 is arranged for securing the wetting layer 22 with the conductive layer 24. The material of the transition layer 23 can combine with the material of the wetting layer 22 as well as the material of the conductive layer 24, such as Copper (Cu), silver (Ag), or alloys thereof. A thickness of the transition layer 23 can range from about 1 to about 10 nanometers. In one embodiment, the material of the transition layer 23 is Cu and the thickness is about 2 nanometers. The transition layer 23 is optional.

The conductive layer 24 is arranged for enhancing the conductivity of the carbon nanotube composite layer 20. The material of the conductive layer 24 can be Cu, Ag, gold (Au) or alloys thereof. A thickness of the conductive layer 24 can range from about 1 to about 20 nanometers. In one embodiment, the material of the conductive layer 24 is Ag and the thickness is about 10 nanometers.

The anti-oxidation layer 25 is arranged for preventing the oxidation of the carbon nanotube composite layer 20 in the making process. The oxidation of the carbon nanotube composite layer 20 will reduce the conductivity thereof. The material of the anti-oxidation layer 25 can be Au, platinum (Pt), and any other anti-oxidation metallic materials or alloys thereof. A thickness of the anti-oxidation layer 25 can range from about 1 to about 10 nanometers. In one embodiment, the material of the anti-oxidation layer 25 is Pt and the thickness is about 2 nanometers. The anti-oxidation layer 25 is optional.

Furthermore, a strengthening layer 26 can be applied on an outer surface of the metal coating 27 to enhance the strength of the carbon nanotube composite layer 20. The material of the strengthening layer 26 can be a polymer with high strength, such as polyvinyl acetate (PVA), polyvinyl chloride (PVC), polyethylene (PE), or paraphenylene benzobisoxazole (PBO). A thickness of the strengthening layer 26 can range from about 0.1 micrometers to 1 micrometer. In one embodiment, the strengthening layer 26 covers the anti-oxidation layer 25, the material of the strengthening layer 26 is PVA, and the thickness of the strengthening layer 26 is about 0.5 micrometers. The strengthening layer 26 is optional.

In one embodiment, a method for making the carbon nanotube composite layer 20 includes the following steps: (a) providing a carbon nanotube film having a plurality of carbon nanotubes; and (b) forming at least one conductive coating on each of the carbon nanotubes in the carbon nanotube film to achieve a carbon nanotube composite layer 20.

In step (a), the carbon nanotube film includes a plurality of carbon nanotubes, and there are interspaces between adjacent two carbon nanotubes. A distance between adjacent two carbon nanotubes can be larger than a diameter of the carbon nanotubes. The carbon nanotube film can have a free-standing structure.

In step (b), the at least one conductive coating can be formed on the carbon nanotube film by means of physical vapor deposition (PVD) such as a vacuum evaporation or a sputtering. In one embodiment, at least one conductive coating is formed by means of vacuum evaporation.

Alternatively, the carbon nanotube composite layer 20 can include a plurality of linear carbon nanotube composite structures. The linear carbon nanotube composite structures can be paralleled with each other, crossed with each other or weaved together to form a layer-shape structure. In one embodiment, the linear carbon nanotube structure can comprises of at least one carbon nanotube wire and metal When the linear carbon nanotube composite structures include two or more carbon nanotube wires, a carbon nanotube cable, the carbon nanotube wires can be parallel with each other or twisted with each other and at least one carbon nanotube wire covered by the metal coating. The carbon nanotube wires include a plurality of carbon nanotubes segments joined end by end by the van der Waals attractive force. The carbon nanotube segments include a plurality of carbon nanotubes 21 parallel to each other and substantially parallel to the carbon nanotube wires In another embodiment, the linear carbon nanotube composite structures can include at least one metal nanowire and at least one carbon nanotube wire. The metal nanowire and the carbon nanotube wire can be parallel or twisted with each other.

Figure 4:
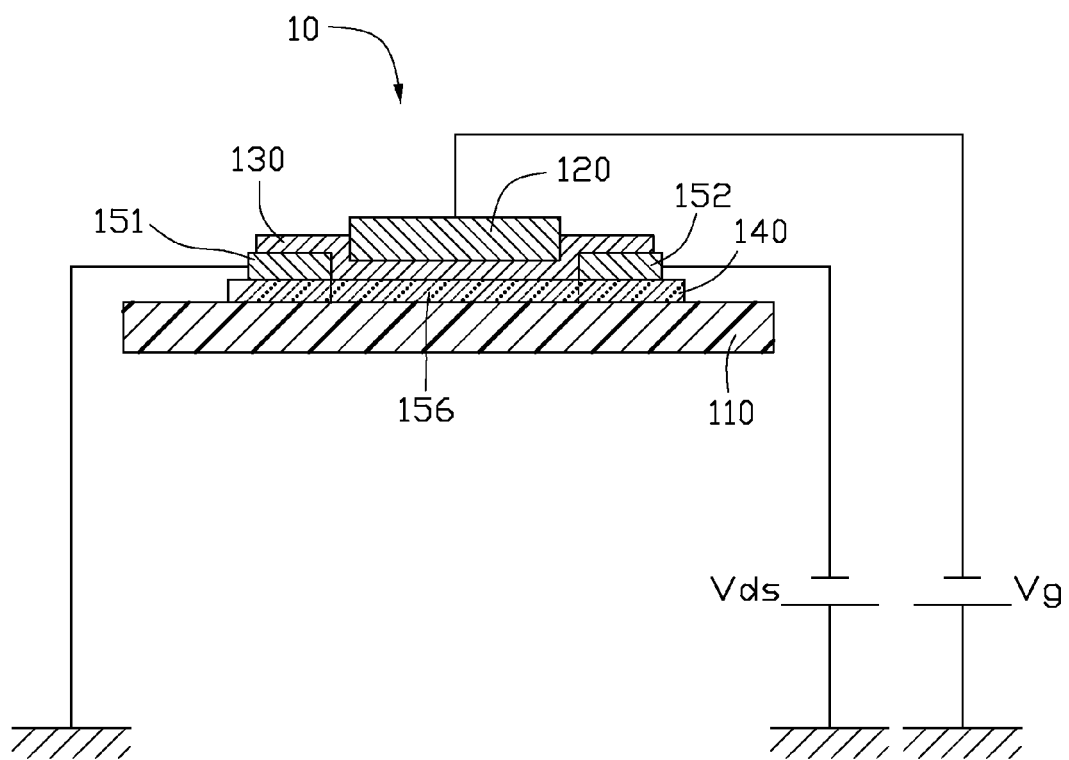
FIG. 4 is a schematic view of the thin film transistor of FIG. 1 connected to a circuit.

Referring to FIG. 4, in use, the source electrode 151 is grounded. A voltage Vds is applied to the drain electrode 152. Another voltage Vg is applied on the gate electrode 120. The voltage Vg can form an electric field in the channel 156 of the semiconducting layer 140. Accordingly, carriers exist in the channel 156. The thin film transistor performs a switching operation by modulating an amount of carriers accumulated in an interface between the insulation layer and the semiconducting layer from an accumulation state to a depletion state. When a voltage is applied to the gate electrode, an amount of the current passing between the drain electrode and the source electrode is changed. As the Vg increases, a current is generated and flows through the channel 156. Thus, the source electrode 151, the drain electrode 152 and a controlled element which the thin film transistor are applied are electrically connected. The gate electrode 120 is used for forming an electrical field in the channel 156 to accumulate carrier in the semiconducting layer 140. The gate electrode 120, the source electrode 151 and drain electrode 152 should have a good conductivity. When the carbon nanotube composite layer 20 is used in the gate electrode 120, the gate electrode can provide a steady voltage and further improve the answer speed of the thin film transistor 10. When the carbon nanotube composite layer 20 is used in the source electrode 151 and/or drain electrode 152, the electrodes can improve the in-out capability of the thin film transistor 10. When a semiconducting carbon nanotube film is used in the semiconducting layer 140, the carrier mobility of the semiconducting carbon nanotubes along the length direction thereof is relatively high, and the carbon nanotubes of the carbon nanotube film are aligned substantially from the source electrode 151 to the drain electrode 152. Therefore, the paths for the carriers to travel in the semiconducting layer 140 are short, causing high carrier mobility. In one embodiment, the carrier mobility of the semiconducting layer 140 is higher than $10\,\mathrm{cm^2/V^{-1}s^{-1}}$ (e.g., 10 to $1500\,\mathrm{cm^2/V^{-1}s^{-1}}$), and the on/off current ratio of the thin film transistor 10 is in a range from about $1\times10^2$ to about $1\times10^6$.

Figure 5:
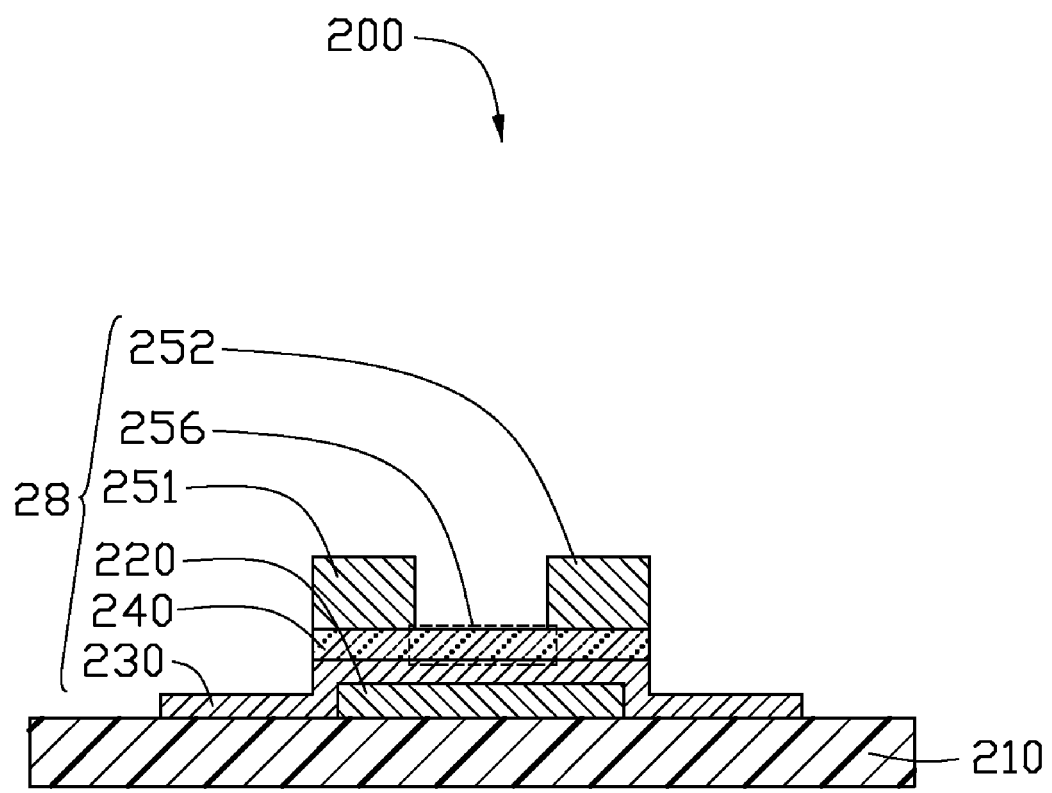
FIG. 5 is a cross sectional view of another embodiment of a thin film transistor.
Figure 6:
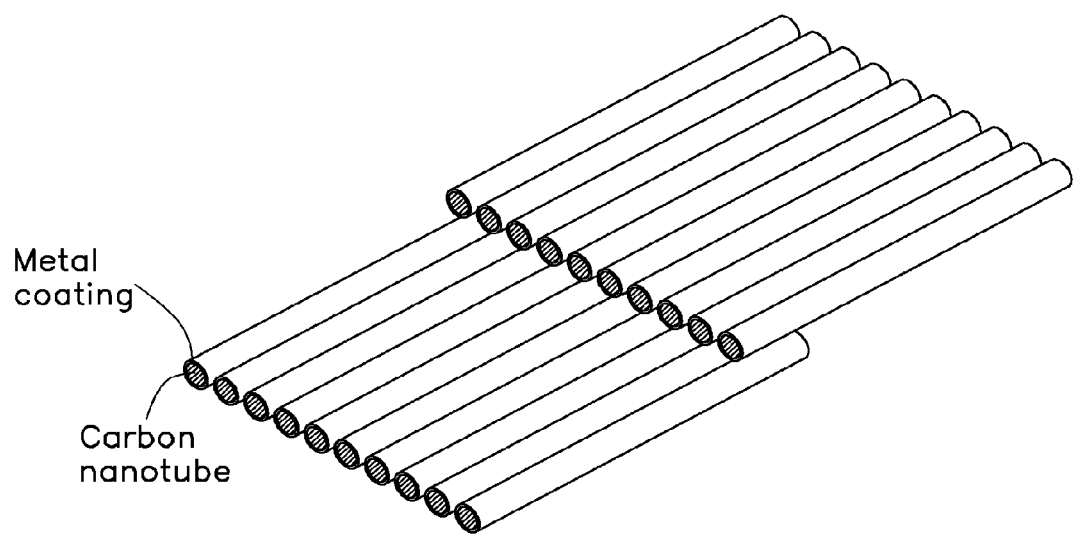
FIG. 6 is a schematic view of one embodiment of a carbon nanotube composite layer.
Figure 7:
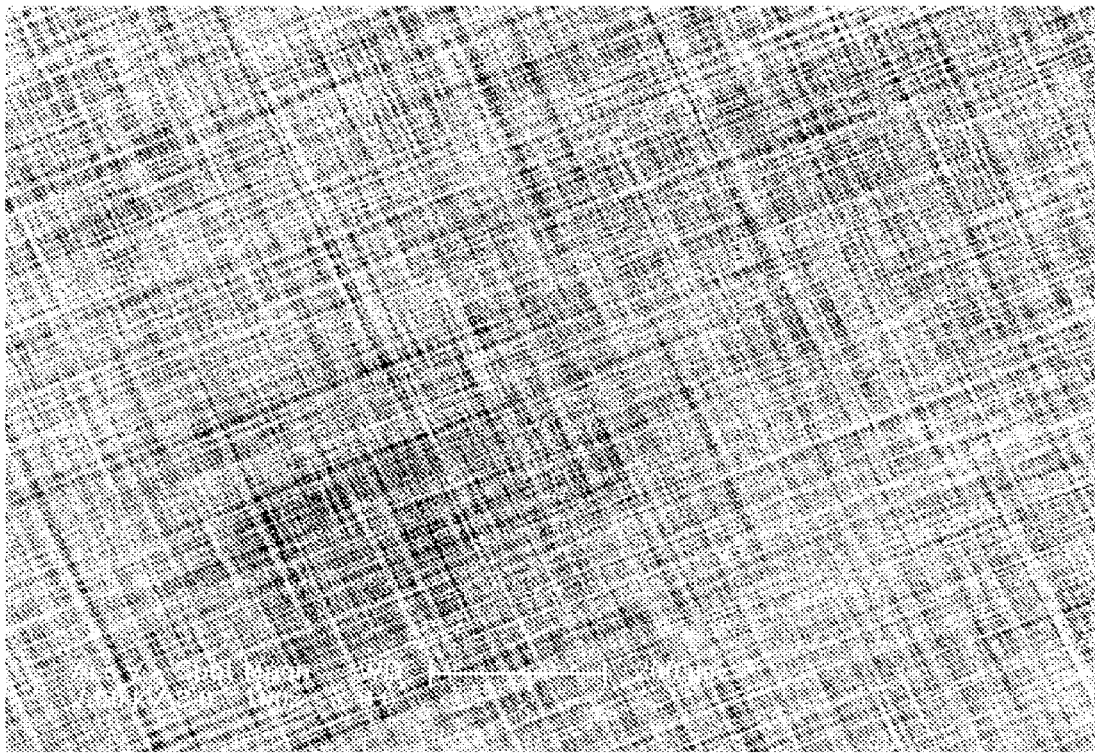
FIG. 7 is a scanning electron microscope image of one embodiment of a carbon nanotube layer.
Figure 8:
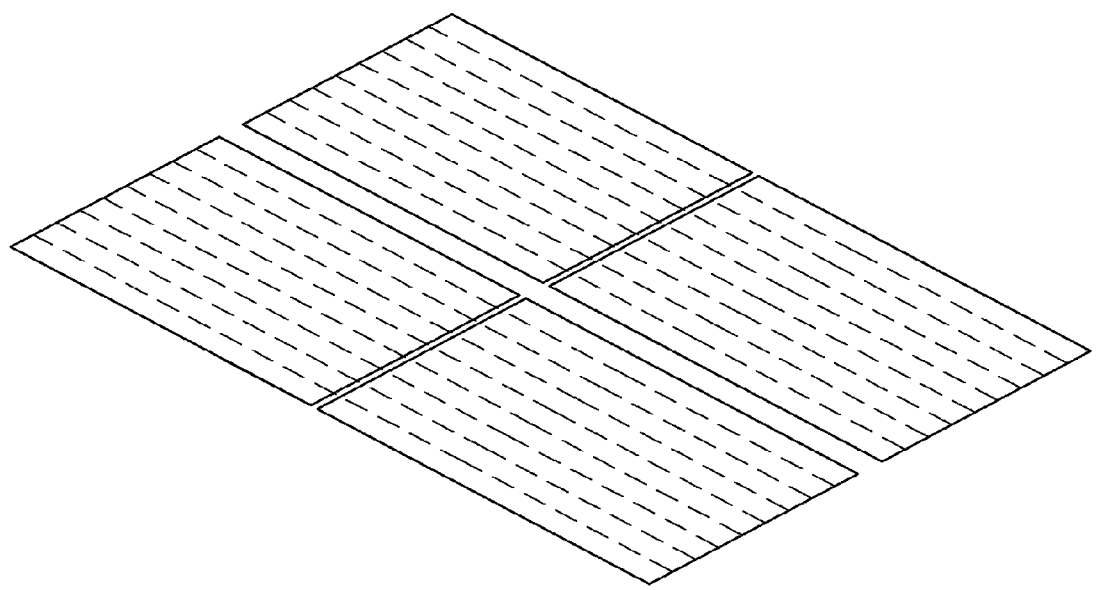
FIG. 8 is a schematic view of one embodiment of a carbon nanotube layer.
Figure 9:
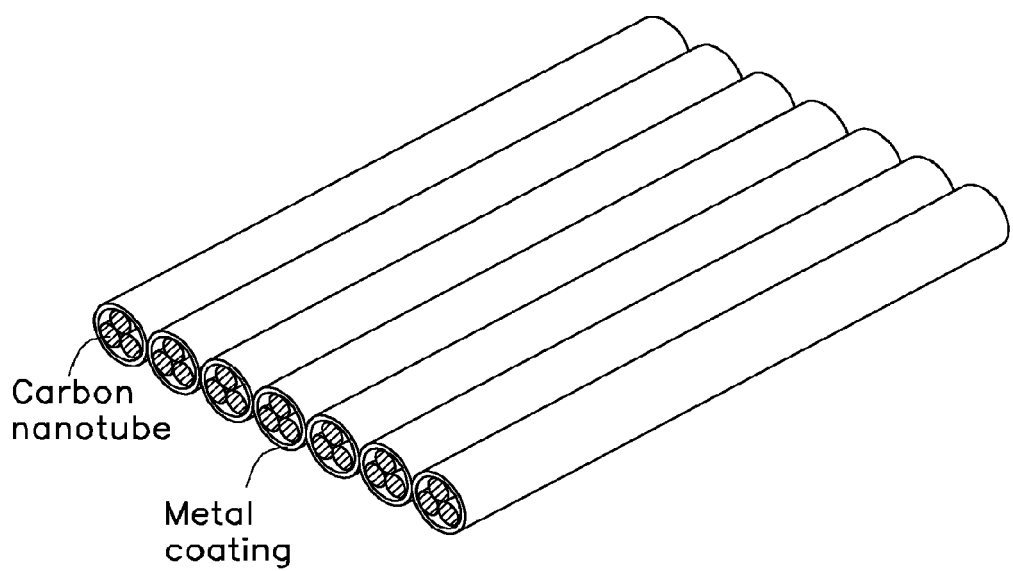
FIG. 9 is a schematic view of one embodiment of a plurality of linear carbon nanotube composite structures.
Figure 10:
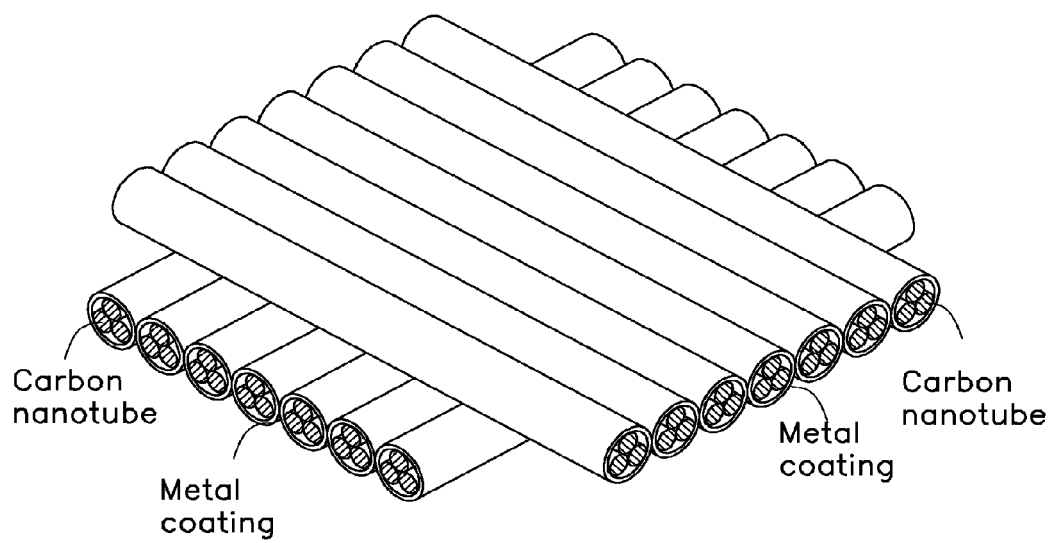
FIG. 10 is a schematic view of one embodiment of a plurality of linear carbon nanotube composite structures.
Figure 11:
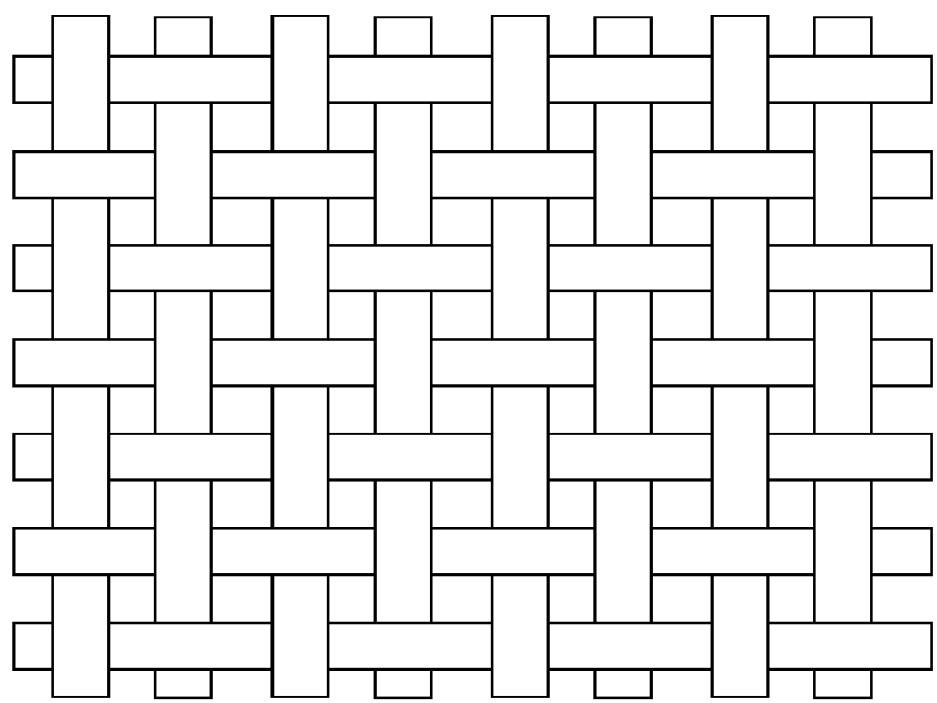
FIG. 11 is a schematic view of one embodiment of a plurality of linear carbon nanotube composite structures.
Figure 12:
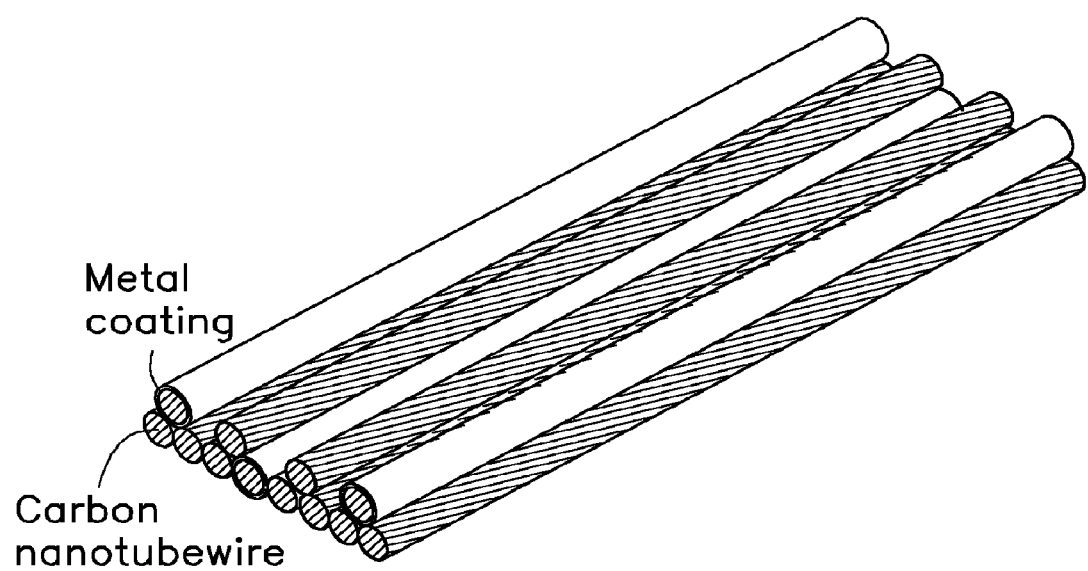
FIG. 12 is a schematic view of one embodiment of a plurality of linear carbon nanotube composite structures.
Figure 13:
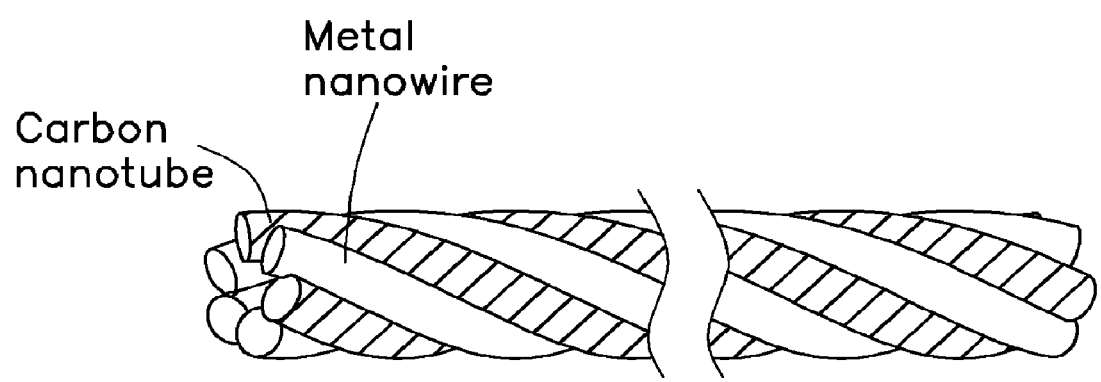
FIG. 13 is a schematic view of one embodiment of a plurality of linear carbon nanotube composite structures.
Figure 14:
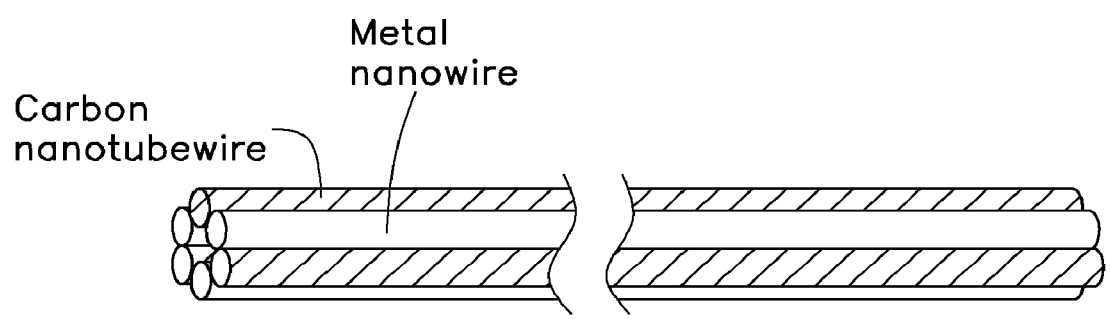
FIG. 14 is a schematic view of one embodiment of a plurality of linear carbon nanotube composite structures.

Referring to FIG. 5, a thin film transistor panel 200 is provided according to another embodiment. The thin film transistor panel 200 includes an insulating substrate 210 and a plurality of thin film transistors 28 (only one is shown in the FIG. 5). The thin film transistors 28 are located on the surface of the insulating substrate 210. The thin film transistors 28 are under gate structure. The thin film transistors 28 include a gate electrode 220, an insulating layer 230, a semiconducting layer 240, a source electrode 251, and a drain electrode 252.

The compositions, features and functions of the compositions, features and functions of the thin film transistor 28 are similar to the thin film transistor 10 described above. The difference is that, the gate electrode 220 is located on the insulating substrate 210. The insulating layer 230 covers the gate electrode 220. The semiconducting layer 240 is located on the insulating layer 230, and insulated from the gate electrode 220 by the insulating layer 230. The source electrode 251 and the drain electrode 252 are spaced apart from each other and connected to the semiconducting layer 240. The source electrode 251, and the drain electrode 252 are insulated from the gate electrode 220 by the insulating layer 230. A channel 256 is located in the semiconducting layer 240 at a region between the source electrode 251 and the drain electrode 252. The channel 156 is a portion of the semiconducting layer 240. In the FIG. 5, the broken lines are used to indicate the region of the channel 256 in the semiconducting layer.

The source electrode 251 and the drain electrode 252 can be located on the semiconducting layer 240 or on the insulating layer 230. In one embodiment, the source electrode 251 and the drain electrode 252 can be located on a top surface of the semiconducting layer 240 and on the same side of the semiconducting layer 240 as the gate electrode 220. In another embodiment, the source electrode 251 and the drain electrode 252 can be located on the insulating layer 230 and covered by the semiconducting layer 240. The source electrode 251 and the drain electrode 252 are on different sides of the semiconducting layer 240 than the gate electrode 220. In other embodiments, the source electrode 251 and the drain electrode 252 can be located on the insulating layer 230, and coplanar with the semiconducting layer 240.

The carbon nanotube composite layer 20 is tough and flexible. Thus, thin film transistors using metallic carbon nanotube composite layer 20 as electrodes can be durable and flexible. The carbon nanotube composite layer 20 is durable at high temperatures. Therefore, the thin film transistor using carbon nanotube composite layer 20 as the electrodes can be used in high temperature. The thermal conductivity of the carbon nanotube composite layer 20 is relatively high. Thus, in use, heat produced by the thin film transistor can be rapidly spread out and easily dissipated. The carbon nanotube composite layer 20 has a high transparency, therefore, the carbon nanotube composite layer acted as electrode can improve the transparency of the thin film transistor. The carbon nanotube composite layer has a good conductivity. Thus when the carbon nanotube composite layer act as electrodes, it can improve the conductivity of the source electrode, drain electrode, and gate electrode.

It is to be understood that the above-described embodiments are intended to illustrate rather than limit the invention. Variations may be made to the embodiments without departing from the spirit of the invention as claimed. The above-described embodiments illustrate the scope of the invention but do not restrict the scope of the invention.

What is claimed is:

1. A thin film transistor comprising:
a source electrode;
a drain electrode spaced apart from the source electrode;
a semiconducting layer electrically connected to the source electrode and the drain electrode;
an insulating layer; and
a gate electrode insulated from the source electrode, the drain electrode, and the semiconducting layer by the insulating layer;
wherein at least one of the gate electrode, the drain electrode and the source electrode comprises a carbon nanotube composite layer, the carbon nanotube composite layer comprises a carbon nanotube layer and a metal coating, the metal coating comprises a wetting layer, a transition layer about the wetting layer, a conductive layer about the transition layer, and an anti-oxidation layer about the conductive layer.

2. The thin film transistor of claim 1, wherein the carbon nanotube layer comprises at least one carbon nanotube film.

3. The thin film transistor of claim 2, wherein a thickness of the at least one carbon nanotube film ranges from about 0.5 nanometers to about 100 micrometers.

4. The thin film transistor of claim 2, wherein the at least one carbon nanotube film comprises a plurality of carbon nanotubes joined end by end by van der Waals attractive force, and the metal coating is located on an outer surface of the plurality of carbon nanotubes.

5. The thin film transistor of claim 2, wherein the at least one carbon nanotube film comprises a plurality of carbon nanotubes substantially aligned along the same direction.

6. The thin film transistor of claim 2, wherein the carbon nanotube layer comprises a plurality of stacked, coplanar or stacked and coplanar carbon nanotube films.

7. The thin film transistor of claim 1, wherein a thickness of the carbon nanotube composite layer ranges from about 1.5 nanometers to about 1 millimeter.

8. The thin film transistor of claim 1, wherein the carbon nanotube composite layer comprises a plurality of linear carbon nanotube composite structures.

9. The thin film transistor of claim 8, wherein the linear carbon nanotube composite structures are parallel with each other, crossed with each other or woven together.

10. The thin film transistor of claim 8, wherein the linear carbon nanotube composite structures comprise at least one carbon nanotube wire and a metal coating located on an outer surface of the carbon nanotube wire.

11. The thin film transistor of claim 10, wherein the linear carbon nanotube composite structures comprise a plurality of carbon nanotube wires parallel or twisted with each other, and at least one of the plurality carbon nanotube wires has the metal coating.

12. The thin film transistor of claim 8, wherein the linear carbon nanotube composite structures comprise at least one metal nanowire and at least one carbon nanotube wire, the metal nanowire and the carbon nanotube wire are parallel or twisted with each other.

13. The thin film transistor of claim 1, wherein the wetting layer is located on the carbon nanotubes; the wetting layer comprises of a material that is selected from a group consisting of iron, cobalt, nickel, palladium, titanium, or alloys thereof; and a thickness of the wetting layer ranges from about 1 to about 10 nanometers.

14. The thin film transistor of claim 1, wherein the material of the transition layer is selected from the group consisting of copper, silver, or alloys thereof; and a thickness of the transition layer ranges from about 1 to about 10 nanometers.

15. The thin film transistor of claim 1, wherein the material of the conductive layer is selected from the group consisting of copper, silver, gold or alloys thereof; and a thickness of the conductive layer ranges from about 1 to about 20 nanometers.

16. The thin film transistor of claim 1, wherein the material of the anti-oxidation layer is selected from the group consisting of gold, platinum, and any other anti-oxidation metallic materials or alloys thereof; and a thickness of the anti-oxidation layer ranges from about 1 to about 10 nanometers.

17. The thin film transistor of claim 1, wherein the semiconducting layer comprises of two layers of drawn carbon nanotube films.

18. A thin film transistor comprising:
a source electrode;
a drain electrode spaced apart from the source electrode;
a semiconducting layer electrically connected to the source electrode and to the drain electrode;
an insulating layer;
a gate electrode insulated from the source electrode, the drain electrode, and the semiconducting layer by the insulating layer; and
wherein each of the gate electrode, the drain electrode, the source electrode comprises a carbon nanotube composite layer, the carbon nanotube composite layer comprises a carbon nanotube layer and a metal coating, the metal coating comprises a wetting layer, a transition layer about the wetting layer, a conductive layer about the transition layer, and an anti-oxidation layer about the conductive layer.

19. A thin film transistor comprising:
a source electrode;
a drain electrode spaced apart from the source electrode;
a semiconducting layer electrically connected to the source electrode and the drain electrode;
an insulating layer; and
a gate electrode insulated from the source electrode, the drain electrode, and the semiconducting layer by the insulating layer;
wherein at least one of the gate electrode, the drain electrode and the source electrode comprises a carbon nanotube composite layer, the carbon nanotube composite layer comprises a carbon nanotube layer and a metal coating, and the metal coating comprises a conductive layer and an anti-oxidation layer about the conductive layer.

* * * * *